(12) United States Patent
Koga et al.

(10) Patent No.: US 7,554,192 B2
(45) Date of Patent: Jun. 30, 2009

(54) SEMICONDUCTOR DEVICE HAVING FILLER WITH THERMAL CONDUCTIVE PARTICLES

(75) Inventors: Masuo Koga, Fukuoka (JP); Tetsuo Mizoshiri, Tokyo (JP); Yukimasa Hayashida, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 131 days.

(21) Appl. No.: 11/553,235

(22) Filed: Oct. 26, 2006

(65) Prior Publication Data

US 2008/0006932 A1   Jan. 10, 2008

(30) Foreign Application Priority Data

Jul. 4, 2006   (JP)   ............................... 2006-184568

(51) Int. Cl.
    *H01L 23/34*   (2006.01)
(52) U.S. Cl. ....................... 257/712; 257/678; 257/713; 257/E23.136
(58) Field of Classification Search .......... 257/E23.051, 257/E23.136, 713
    See application file for complete search history.

(56) References Cited

U.S. PATENT DOCUMENTS

2002/0070439 A1* 6/2002 Hiramatsu et al. .......... 257/687
2002/0074146 A1* 6/2002 Okubora ..................... 174/52.2
2004/0087057 A1* 5/2004 Wang et al. ................. 438/106
2005/0023033 A1* 2/2005 Saiki et al. .................. 174/260

FOREIGN PATENT DOCUMENTS

JP         63-96945       4/1988
WO     WO 02/19423 A1    3/2002

OTHER PUBLICATIONS

U.S. Appl. No. 11/538,232, filed Oct. 3, 2006, Koga, et al.

* cited by examiner

*Primary Examiner*—Lynne A. Gurley
*Assistant Examiner*—Vernon P Webb
(74) *Attorney, Agent, or Firm*—Oblon, Spivak, McClelland, Maier & Neustadt, P.C.

(57) ABSTRACT

A semiconductor device that includes an insulating substrate having an upper conductor formed on an upper surface thereof and a lower conductor formed on a lower surface of the insulating substrate. The device also includes a semiconductor element mounted on the upper surface of the insulating substrate with an under-element solder therebetween. The device further includes a heat sink whereon the insulating substrate is mounted with an under-substrate solder therebetween. The device additionally includes a silicone gel covering the semiconductor element, the under-element solder, and the upper conductor. In addition, the device includes a filler covering the lower conductor and the under-substrate solder, without covering the semiconductor element, the under-element solder, and the upper conductor, and having a thermal conductivity larger than a thermal conductivity of air and a fluidity higher than a fluidity of the silicone gel.

3 Claims, 2 Drawing Sheets

SEMICONDUCTOR DEVICE HAVING FILLER WITH THERMAL CONDUCTIVE PARTICLES

BACKGROUND OF THE INVENTION

1. Field of the Invention

The present invention relates to a semiconductor device wherein an insulating substrate carrying a semiconductor element is mounted on a heat sink, and specifically to a semiconductor device of a low price and a long life.

2. Background Art

FIG. 5 is a sectional view showing a conventional semiconductor device; and FIG. 6 is an enlarged sectional view of the chief part of the semiconductor device. An insulating substrate 11 has an upper conductor 12 formed on the upper surface thereof and a lower conductor 13 formed on the lower surface thereof. A semiconductor element 14 is mounted on the insulating substrate 11 with an under-element solder 15 therebetween. The insulating substrate 11 is mounted on a heat sink 16 with an under-substrate solder 17 therebetween. On the periphery of the heat sink 16, a case 18 is fixed by an adhesive 19, and inside the heat sink 16, a silicone gel 20 is injected for securing insulation.

There has been proposed a technique to improve the heat dissipation of a semiconductor chip by filling an insulating liquid having high thermal conductivity in a heat-radiating case accommodating a semiconductor chip and a heat sink (For example, refer to Japanese Patent Laid-Open No. 63-096945).

By the repetitive heating and cooling due to the operation of the semiconductor element 14, the insulating substrate 11 and the heat sink 16 are expanded and contracted. Thereby, when the semiconductor device is used for a long period of time, cracks 21 are produced in the under-substrate solder 17. Since the portions of the cracks 21 constitute air layers that have very small thermal conductivity, heat transfer from the semiconductor element 14 to the heat sink 16 is lowered. There was a problem wherein the semiconductor element 14 was abnormally heated, the semiconductor device was destroyed, and the life of the semiconductor device was shortened. In the technique of Patent Document 1, an insulating liquid had to be used, and a conductive substance having high heat radiation could not be used. Therefore, heat radiation was insufficient.

In contrast, when a long life was required, a low linear expansion material, such as aluminum silicon carbide (AlSiC) and copper molybdenum (CuMo), was used in place of copper (Cu) generally used as the material for the heat sink. In this case, although cracks were not easily produced in the under-substrate solder, there was a problem of high material costs.

SUMMARY OF THE INVENTION

To solve the above-described problems, it is an object of the present invention to provide a semiconductor device of a low price and a long life.

A semiconductor device according to the present invention has an insulating substrate having an upper conductor formed on the upper surface and a lower conductor formed on the lower surface; a semiconductor element mounted on the insulating substrate with an under-element solder therebetween; a heat sink whereon the insulating substrate is mounted with an under-substrate solder therebetween; a silicone gel covering the semiconductor element, the under-element solder and the upper conductor; and a filler covering the lower conductor and the under-substrate solder, and having a thermal conductivity larger than the thermal conductivity of air and a fluidity higher than the fluidity of the silicone gel.

According to the present invention, even if cracking occurs in the under-substrate solder, a filler flows into cracks, and heat transfer from the semiconductor element to the heat sink is not much lowered. Therefore, even when a long life is required, a heat sink composed of an inexpensive copper (Cu) material can be used. Consequently, a semiconductor device of a low price and a long life can be obtained.

Other and further objects, features and advantages of the invention will appear more fully from the following description.

DETAILED DESCRIPTION OF THE PREFERRED EMBODIMENTS

First Embodiment

Figure 1:
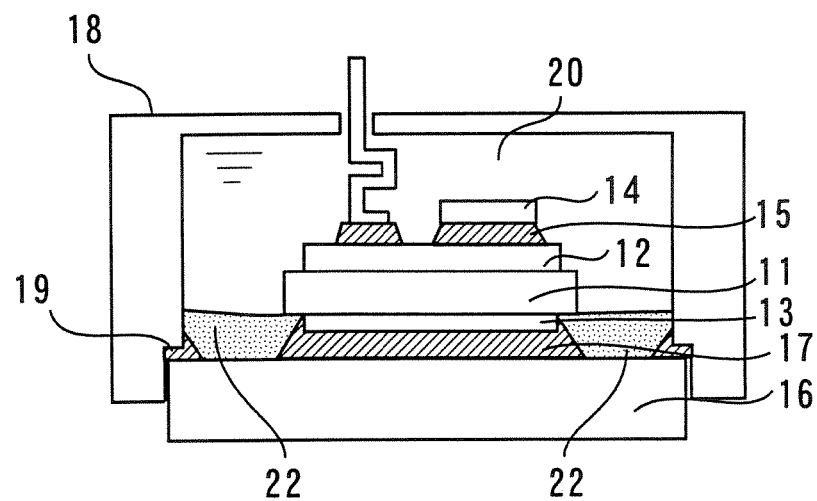
FIG. 1 is a sectional view showing a semiconductor device according to the first embodiment.
Figure 2:
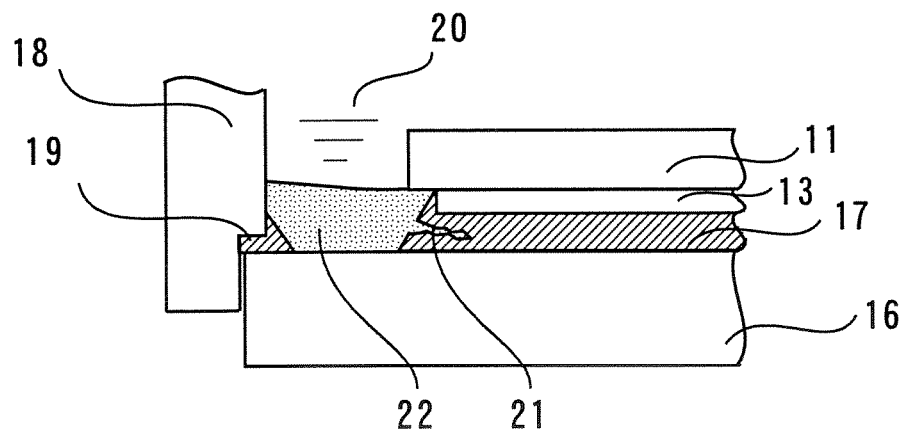
FIG. 2 is an enlarged sectional view of the chief part of the semiconductor device according to the first embodiment of the present invention.

FIG. 1 is a sectional view showing a semiconductor device according to the first embodiment; and FIG. 2 is an enlarged sectional view of the chief part of the semiconductor device.

An insulating substrate 11 has an upper conductor 12 formed on the upper surface thereof and a lower conductor 13 formed on the lower surface thereof. A semiconductor element 14 is mounted on the insulating substrate 11 with an under-element solder 15 therebetween. The lower conductor 13 of the insulating substrate 11 is connected to a heat sink 16 with an under-substrate solder 17 therebetween. On the periphery of the heat sink 16, a case 18 is fixed by an adhesive 19.

The filler 22 injected in the case 18 covers the lower conductor 13 and the under-substrate solder 17, and the silicone gel 20 injected on the filler 22 covers the semiconductor element 14, the under-element solder 15 and the upper conductor 12.

As the filler 22, a material having larger thermal conductivity than air and higher fluidity than the silicone gel 20 is used. As such a filler 22, for example, a fluorine-based inactive liquid can be used. Specifically, when Fluorinert FC-40 (product name) of Sumitomo 3M, Ltd. is used, the thermal conductivity of the Fluorinert is 0.067 W/mK compared with the thermal conductivity of air or 0.024 W/mK. The Fluorinert has a higher fluidity than silicone gel.

Thereby, even if a crack 21 is produced in the under-substrate solder 17, the filler 22 enters inside the crack 21 to suppress the lowering of heat transfer characteristics from the semiconductor element 14 to the heat sink 18 compared with the case of conventional silicone gel. Therefore, even when a long life is required, the heat sink 16 composed of an inexpensive copper (Cu) material can be used. Therefore a semiconductor device of a low price and a long life can be obtained.

Second Embodiment

Figure 3:
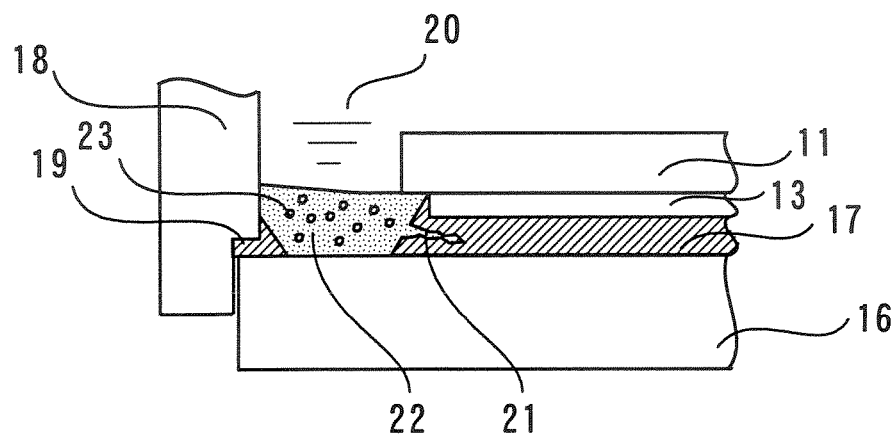
FIG. 3 is an enlarged sectional view of the chief part of the semiconductor device according to the second embodiment of the present invention.

FIG. 3 is an enlarged sectional view of the chief part of the semiconductor device according to the second embodiment of the present invention. A filler 22 contains fine particles 23 having a thermal conductivity higher than the thermal conductivity of the filler 22 itself. Other constituents are the same as the first embodiment. Thereby, since the thermal conductivity of the filler 22 is improved, the life of the semiconductor device becomes longer than the life of the first embodiment.

As the fine particles 23, a metal such as copper (Cu) and nickel (Ni), carbon nanotube or the like can be used. The thermal conductivity of the Fluorinert used here as the filler 22 is 0.067 W/mK, while the thermal conductivity of copper is 400 W/mK and the thermal conductivity of carbon nanotube is 6000 W/mK.

In addition, when 0.7% or more carbon nanotube is contained in the Fluorinert, the thermal conductivity thereof becomes higher than the thermal conductivity of solder (38 w/mK). In this case, even if a crack 21 is produced in the under-substrate solder 17, the filler 22 enters inside the crack 21, and the heat radiation is even improved. Since carbon nanotube has a diameter of not more than 1 nm and a length of not more than 10 nm, the fluidity of the filler 22 containing carbon nanotubes is high, and the filler 22 can enter in the crack 21 of a height of several tens of micrometers.

The filler 22 containing conductive fine particles 23 is not insulating. However, since the filler 22 covers only the lower conductor 13 and the under-substrate solder 17, and since the semiconductor element 14, the under-element solder 15 and the upper conductor 12 are covered with the silicone gel 20, the lower conductor 13, the semiconductor element 14 and the like are not short-circuited.

Third Embodiment

Figure 4:
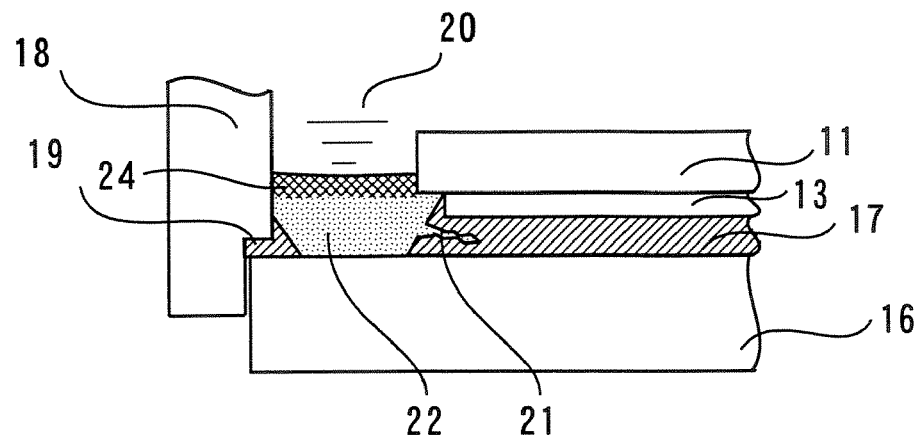
FIG. 4 is an enlarged sectional view of the chief part of the semiconductor device according to the third embodiment of the present invention.
Figure 5:
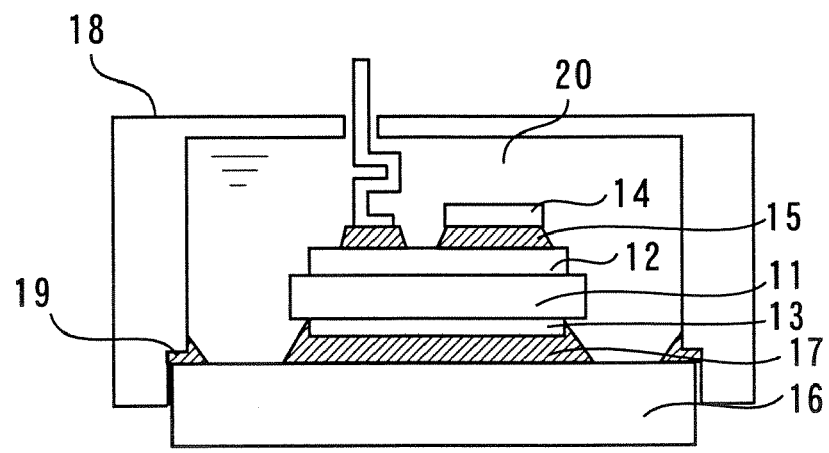
FIG. 5 is a sectional view showing a conventional semiconductor device.
Figure 6:
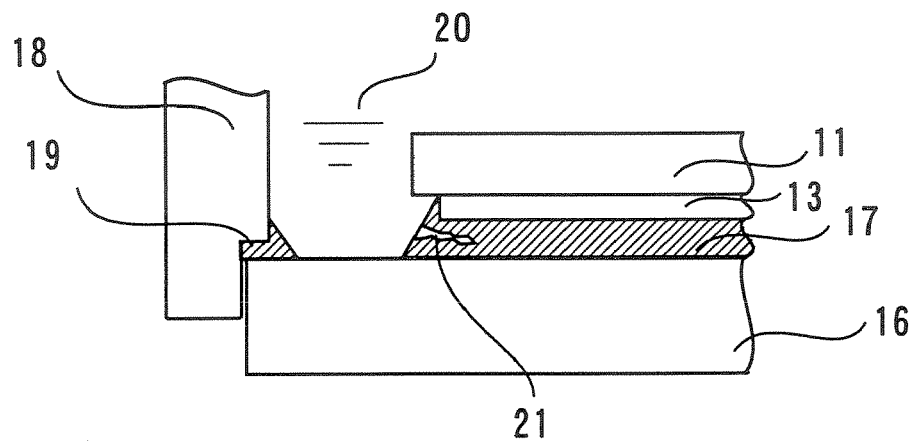
FIG. 6 is an enlarged sectional view of the chief part of the semiconductor device.

FIG. 4 is an enlarged sectional view of the chief part of the semiconductor device according to the third embodiment of the present invention. As FIG. 4 shows, a cured layer 24 is formed on the uppermost portion of the filler 22. The cured layer 24 can be formed by using a filler 22 that is cured by radiating ultraviolet beams or the like; or by applying a thin layer of a thermosetting resin (including silicone gel or the like) onto the surface of the filler 22, and conducting a heat treatment. Other constituents are the same as the first and second embodiments. Thereby, the third embodiment not only has similar advantages to the first and second embodiments, but also provides for consistent height of a filler and facilitates the injection of the silicone gel 20 that covers the semiconductor element 14, the under-element solder 15 and the upper conductor 12. Therefore, the quality and reliability of the semiconductor device can be improved.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-184568, filed on Jul. 7, 2006 including specification, claims, drawings and summary, on which the Convention priority of the present application is based, are incorporated herein by reference in its entirety.

What is claimed is:

1. A semiconductor device, comprising:
   an insulating substrate having an upper conductor formed on an upper surface thereof and a lower conductor formed on a lower surface of the insulating substrate;
   a semiconductor element mounted on the upper surface of said insulating substrate with an under-element solder therebetween;
   a heat sink whereon the lower surface of said insulating substrate is mounted with an under-substrate solder therebetween;
   a silicone gel covering said semiconductor element, said under-element solder, and said upper conductor; and
   a filler covering said lower conductor and said under-substrate solder, without covering said semiconductor element, said under-element solder, and said upper conductor, and having a thermal conductivity larger than a thermal conductivity of air and a fluidity higher than a fluidity of said silicone gel.

2. The semiconductor device according to claim 1, wherein said filler contains fine particles having a thermal conductivity higher than the thermal conductivity of said filler per se.

3. The semiconductor device according to claim 1, wherein said filler has a cured layer formed on an uppermost part thereof.

* * * * *